United States Patent
Benz et al.

(10) Patent No.: US 7,325,293 B2
(45) Date of Patent: Feb. 5, 2008

(54) ZIRCONIA-STABILIZED MULTI-FILAMENTARY NIOBIUM-TIN SUPERCONDUCTING WIRE

(75) Inventors: Mark Gilbert Benz, Lincoln, VT (US); Theodore McCall Evenden, Pattersonville, NY (US); Judson Sloan Marte, Wynantskill, NY (US); Thomas Robert Raber, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/406,636

(22) Filed: Apr. 19, 2006

(65) Prior Publication Data

US 2006/0207787 A1   Sep. 21, 2006

Related U.S. Application Data

(62) Division of application No. 10/248,339, filed on Jan. 10, 2003, now abandoned.

(51) Int. Cl.
*H01B 12/00* (2006.01)
*H01B 13/00* (2006.01)

(52) U.S. Cl. .......................... 29/599; 148/96; 148/98; 148/422; 174/125.1; 420/426; 420/901; 505/806

(58) Field of Classification Search .................. 29/599; 148/96, 98, 422; 174/125.1; 420/426, 901, 420/425; 505/806, 813
See application file for complete search history.

(56) References Cited

U.S. PATENT DOCUMENTS 3,509,622 A * 5/1970 Elbindari et al. ............. 29/599
3,625,662 A * 12/1971 Roberts et al. ............. 428/610
3,728,165 A    4/1973 Howlett ........................ 148/96

(Continued)

FOREIGN PATENT DOCUMENTS

EP    A0576902    1/1994
EP    A0701291    3/1996

OTHER PUBLICATIONS

Rumaner et al., Effect of Oxygen and Zirconium on the Growth and Superconducting properties of Nb3Sn, 1994, Metallurgical and Materials Transactions A, vol. 25A, pp. 203-212.*

(Continued)

*Primary Examiner*—Peter Vo
*Assistant Examiner*—Livius R. Cazan
(74) *Attorney, Agent, or Firm*—Jean K. Testa; Curtis B. Brueske

(57) ABSTRACT

A multi-filament superconducting wire in which the filaments comprise zirconia-stabilized ultra-fine grain $Nb_3Sn$. The superconducting wire is formed by wire-drawing a preform comprising a metallic matrix and at least one niobium alloy rod having zirconium and oxygen in solid solution and heat treating the drawn wire in the presence of tin to yield at least one continuous filament comprising ultra-fine grain $Nb_3Sn$ having semi-coherent $ZrO_2$ precipitates disposed therein. The $ZrO_2$ precipitates serve to stabilize the ultra-fine grain microstructure of the $Nb_3Sn$ at temperatures up to 1100° C. and allows $Nb_3Sn$ to maintain the ultra-fine grain microstructure when heat treated at temperatures that are greater than those previously used. By using higher temperatures to form $Nb_3Sn$, the time required for heat treatment can be significantly reduced.

33 Claims, 4 Drawing Sheets

U.S. PATENT DOCUMENTS

| | | | |
|---|---|---|---|
| 3,838,503 A | 10/1974 | Crow et al. | 29/599 |
| 4,224,087 A * | 9/1980 | Tachikawa et al. | 148/98 |
| 4,324,842 A | 4/1982 | Thomas et al. | 428/614 |
| 4,531,982 A * | 7/1985 | Dubots | 148/96 |
| 5,472,936 A | 12/1995 | Benz et al. | |
| 5,505,790 A | 4/1996 | Benz et al. | |
| 5,522,945 A * | 6/1996 | Murray et al. | 148/96 |
| 5,540,787 A | 7/1996 | Johnson et al. | |
| 6,172,588 B1 | 1/2001 | Laskaris et al. | |

OTHER PUBLICATIONS

Smathers, David B., A15 Superconductors, 1990, Metals Handbook, 10th Edition, vol. 2; electronic copyfrom http://products.asminternational.org.*

Search Report.

* cited by examiner

ZIRCONIA-STABILIZED MULTI-FILAMENTARY NIOBIUM-TIN SUPERCONDUCTING WIRE

CROSS-REFERENCE TO RELATED APPLICATIONS

This Application is a DIVISION of U.S. patent application Ser. No. 10/248,339, filed Jan. 10, 2003 now abandoned.

BACKGROUND OF INVENTION

The invention is related to superconducting wire having at least one filament of superconducting material. More particularly, the invention relates to a multi-filament superconducting wire comprising a zirconia-stabilized, niobium tin superconductor and a matrix material, and a method of making such a multi-filament superconducting wire.

Superconducting wires comprising multiple filaments of niobium-based superconductors, such as niobium tin (hereinafter referred to as "$Nb_3Sn$"), are used in a variety of electromagnetic applications, such as magnets, motors, and transformers. To maintain sufficient critical current density in the superconducting wire during operation at cryogenic temperatures of less than 17.5 K, the $Nb_3Sn$ comprising filaments within the wire must have an ultra-fine grain size of less than about 1 micron. One of the processes that is used to manufacture multi-filament $Nb_3Sn$ wire is the "bronze process," in which ultra-fine grains of $Nb_3Sn$ are formed on the surface of wire-drawn niobium filaments by heat treatment for several days at relatively low temperatures.

The length of the heat treatment required to produce ultra-fine grain $Nb_3Sn$ is exceedingly time-intensive and uneconomical. Therefore, what is needed is a superconducting wire comprising ultra-fine grain $Nb_3Sn$ that is formed by a more rapid process. What is also needed is a method of more rapidly making a multi-filament superconducting wire comprising ultra-fine grained $Nb_3Sn$.

SUMMARY OF INVENTION

The present invention meets these and other needs by providing a multi-filament superconducting wire in which the filaments comprise zirconia-stabilized ultra-fine grained (also referred to hereinafter as "UFG") $Nb_3Sn$. The superconducting wire is formed by deformation processing of a preform comprising a metallic matrix and at least one niobium alloy rod having precipitates of zirconia, also known as zirconium oxide and hereinafter referred to as "$ZrO_2$." The $ZrO_2$ precipitates serve to stabilize the ultra-fine grained microstructure of the $Nb_3Sn$ at temperatures up to 1100° C. and allows $Nb_3Sn$ to maintain the ultra-fine grained microstructure when heat treated at temperatures that are greater than those previously used. By using higher temperatures to form $Nb_3Sn$, the time required for heat treatment can be significantly reduced.

Accordingly, one aspect of the invention is to provide a superconducting wire. The superconducting wire comprises: at least one filament having a filament diameter, wherein the at least one filament is continuous and comprises a plurality of $Nb_3Sn$ grains having a plurality of $ZrO_2$ precipitates disposed therein, and wherein the plurality of $Nb_3Sn$ grains have an average grain size of less than about 10 percent of the filament diameter; and a metallic matrix surrounding and contacting the at least one filament, wherein the metallic matrix is electrically conductive at temperatures below about 77 K and has a coefficient of thermal expansion that is substantially the same as or greater than that of $Nb_3Sn$.

A second aspect of the invention is to provide a preform for forming a superconducting wire comprising at least one filament having a filament diameter, wherein the at least one filament comprises a plurality of $Nb_3Sn$ grains having a plurality of $ZrO_2$ precipitates disposed therein and a metallic matrix surrounding and contacting the at least one filament. The preform comprises: at least one niobium alloy rod comprising a niobium alloy having oxygen and zirconium in solid solution, wherein zirconium and oxygen are present in an atomic ratio of about 1:2; and a metallic preform matrix surrounding and contacting the at least one niobium alloy rod, wherein the metallic preform matrix comprises tin.

A third aspect of the invention is to provide a superconducting wire, formed from a preform comprising at least one niobium alloy rod comprising a niobium alloy having oxygen and zirconium in solid solution, wherein zirconium and oxygen are present in an atomic ratio of about 1:2, and a metallic preform matrix surrounding and contacting the at least one niobium alloy rod, wherein the metallic preform matrix comprises tin. The superconducting wire comprises: a plurality of filaments, wherein each of the plurality of filaments is continuous and has a filament diameter, wherein at least one filament comprises a plurality of $Nb_3Sn$ grains having a plurality of $ZrO_2$ precipitates disposed therein, and wherein the plurality of $Nb_3Sn$ grains has an average grain size of less than about 10 percent of the filament diameter; and a metallic matrix surrounding and contacting the plurality of filaments, wherein the metallic matrix is electrically conductive at temperatures below about 77 K and has a coefficient of thermal expansion that is substantially the same as or greater than that of $Nb_3Sn$.

A fourth aspect of the invention is to provide an electromagnetic device comprising at least one superconducting wire, wherein the superconducting wire is formed from a preform comprising at least one niobium alloy rod comprising a niobium alloy having oxygen and zirconium in solid solution, wherein zirconium and oxygen are present in an atomic ratio of about 1:2, and a metallic preform matrix surrounding and contacting the at least one niobium alloy rod, and wherein the metallic preform matrix comprises tin. The superconducting wire comprises: a plurality of filaments, wherein each of the plurality of filaments has a filament diameter, wherein at least one filament is continuous and comprises a plurality of $Nb_3Sn$ grains having a plurality of $ZrO_2$ precipitates disposed therein, wherein the plurality of $Nb_3Sn$ grains has an average grain size of less than about 10 percent of the filament diameter; and a metallic matrix surrounding and contacting the plurality of filaments, and wherein the metallic matrix is electrically conductive at temperatures below about 77 K and has a coefficient of thermal expansion that is substantially the same as or greater than that of $Nb_3Sn$.

A fifth aspect of the invention is to provide a method of making a superconducting wire comprising at least one filament, wherein the at least one filament is continuous and comprises a plurality of $Nb_3Sn$ grains having a plurality of $ZrO_2$ precipitates disposed therein and a metallic matrix surrounding and contacting the at least one filament. The method comprises the steps of: providing a niobium alloy having oxygen and zirconium in solid solution, wherein zirconium and oxygen are present in an atomic ratio of about 1:2; forming at least one niobium alloy rod from the niobium alloy; providing a metallic matrix material to the at least one niobium alloy rod; forming a wire from the metallic matrix material and the at least one niobium alloy rod; and heat treating the wire at a predetermined temperature for a predetermined time, thereby forming the superconducting wire.

A sixth aspect of the invention is to provide a method of making a preform for a superconducting wire comprising at least one niobium alloy rod having oxygen and zirconium in solid solution, wherein zirconium and oxygen are present in an atomic ratio of about 1:2, and a metallic preform matrix surrounding and contacting the at least one niobium alloy rod. The method comprises the steps of: providing a niobium alloy having oxygen and zirconium in solid solution, wherein zirconium and oxygen are present in an atomic ratio of about 1:2; forming at least one niobium alloy rod from the niobium alloy; providing a metallic matrix material to the at least one niobium alloy rod; and forming a preform by surrounding the at least one niobium alloy rod with the metallic matrix material such that the metallic matrix material contacts the at least one niobium alloy rod.

A seventh aspect of the invention is to provide a superconducting wire comprising: at least one filament having a filament diameter, wherein the at least one filament is continuous and comprises a plurality of $Nb_3Sn$ grains having a plurality of $ZrO_2$ precipitates disposed therein, wherein the plurality of $Nb_3Sn$ grains have an average grain size of less than about 10 percent of the filament diameter; and a metallic matrix surrounding and contacting the at least one filament, wherein the metallic matrix has a coefficient of thermal expansion that is substantially the same as or greater than that of $Nb_3Sn$, and wherein the superconducting wire is formed by: providing a niobium alloy having oxygen and zirconium in solid solution, wherein zirconium and oxygen are present in an atomic ratio of about 1:2; forming at least one niobium alloy rod from the niobium alloy; providing a metallic matrix material to the at least one niobium alloy rod; forming a wire from the metallic matrix material and the at least one niobium alloy rod; and heat treating the wire at a predetermined temperature for a predetermined time to form the superconducting wire.

These and other aspects, advantages, and salient features of the present invention will become apparent from the following detailed description, the accompanying drawings, and the appended claims.

DETAILED DESCRIPTION

Figure 1:
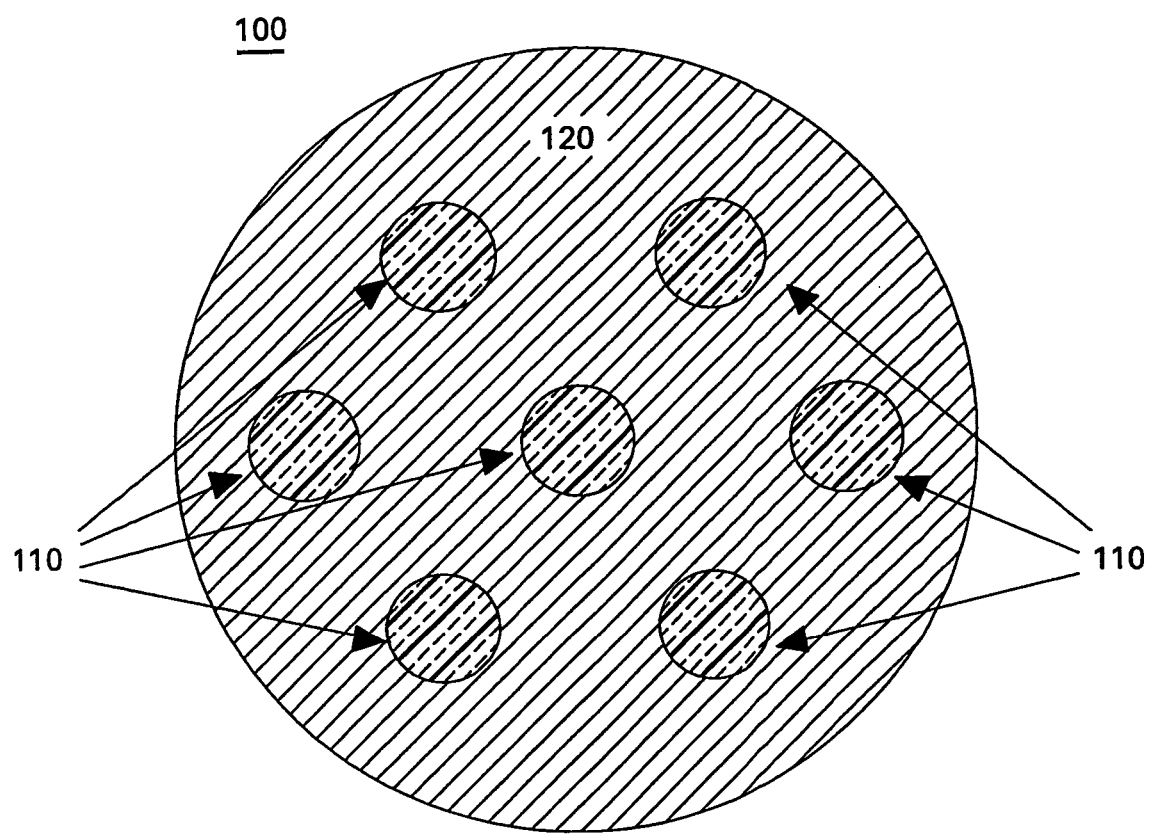
FIG. 1 is a schematic representation of a cross-sectional view of the superconducting wire of the present invention.

In the following description, like reference characters designate like or corresponding parts throughout the several views shown in the figures. It is also understood that terms such as "top," "bottom," "outward," "inward," and the like are words of convenience and are not to be construed as limiting terms.

Referring to the drawings in general and to FIG. 1 in particular, it will be understood that the illustrations are for the purpose of describing one embodiment of the invention and are not intended to limit the invention thereto.

FIG. 1 is a schematic representation of a cross-sectional view of the superconducting wire 100 of the present invention. Superconducting wire 100 includes at least one filament 110. Although seven such filaments 110 are represented in FIG. 1, there is no limit to the number of filaments 100 contained within superconducting wire 100. Superconducting wire 100 may, for example, comprise a monofilament.

Filament 110 comprises a plurality of niobium-tin (hereinafter referred to as "$Nb_3Sn$") grains that form continuous filament 110. A plurality of zirconium oxide (hereinafter referred to as "$ZrO_2$") precipitates are present within the plurality of $Nb_3Sn$ grains. The $ZrO_2$ precipitates serve to stabilize the ultra-fine grained microstructure of the $Nb_3Sn$ at temperatures up to 1100° C. and inhibit $Nb_3Sn$ grain growth, thus allowing $Nb_3Sn$ to maintain the ultra-fine grained microstructure when heat treated at temperatures that are greater than those previously used. At least one semi-coherent $ZrO_2$ precipitate is present in each of the plurality of $Nb_3Sn$ grains to stabilize each $Nb_3Sn$ grain and inhibit $Nb_3Sn$ grain growth.

Superconducting $Nb_3Sn$ having $ZrO_2$ precipitates has been previously described in: U.S. Pat. No. 5,505,790, entitled "Method for Enhancing Critical Current in Triniobium Tin" by Mark G. Beuz, Howard R. Hart, Jr., Melissa L. Murray, Robert L. Zabala, Bruce A. Knudsen, and Thomas R. Raber, issued on Apr. 9, 1999; U.S. Pat. 5,522,945, entitled "Method for Forming Triniobium Tin Superconductor with Bismuth," by Melissa L. Murray, Mark G. Benr, and Bruce A. Knudsen, issued on Jun. 4, 1996; U.S. Pat. No. 5,540,787, entitled "Method of Forming Triniobium Tin Superconductor." by Neil A. Johnson, Melissa L. Murray, Thomas R. Raber, and Mark G. Benz, issued on Jul. 30, 1996; and U.S. Pat. No. 5,472,936, entitled "Method for Making Triniobium Tin Semiconductor," by Mark G. Benz, Neil A. Johnson, Melissa L. Murray, Robert I. Zabala, Louis E. Hibbs, Jr., and Bruce A. Knudsen, issued on Dec. 5, 1995, which arc incorporated herein by reference in their entirety.

The plurality of $Nb_3Sn$ grains are ultrafine grains (also referred to hereinafter as "UFG") having an average grain size that is less than about 10 percent of the diameter of filament 110. The diameter of filament 110 is less than about 10 microns; thicker filaments tend to fracture more easily when wire 100 is bent or wound, as is common in applications for which wire 100 is intended. In one embodiment, filament 110 has a diameter of less than about 2 microns, and, preferably, between about 1 micron and about 2 microns. Likewise, larger $Nb_3Sn$ grain sizes impede the ability of filament 110 to bend. The average grain size of the plurality of $Nb_3Sn$ grains is less than about 1 micron, and, preferably, less than about 200 nanometers.

In one embodiment, wire 100 further includes at least one filament 110 that comprises another superconducting material, such as, but not limited to, elemental niobium, niobium zirconium alloy, and combinations thereof.

The at least one filament 110 is surrounded by a metallic matrix 120, which surrounds and contacts the at least one filament 110. Metallic matrix material 120 is electrically conductive at cryogenic temperatures (i.e., below about 77 K). In order to prevent breakage of wire 100 during cycling between room temperature and cryogenic temperatures, metallic matrix has a coefficient of thermal expansion that is compatible with that of the plurality of $Nb_3Sn$ grains that form the at least one filament 110. In the temperature range 4.2 K to 456 K, $Nb_3Sn$ has a coefficient of thermal expansion ($\Delta L/L_o$) of 0.282%. When metallic matrix 120 has a coefficient of thermal expansion that is substantially the same as that of $Nb_3Sn$, zero strain is imparted to the at least one filament 110. When metallic matrix 120 has a coefficient of thermal expansion that is greater than that of $Nb_3Sn$, a compressive stress—which tends to increase the critical current of the at least one filament 110 and superconducting wire 100—is imparted to the at least one filament 110. If metallic matrix 120 has a coefficient of thermal expansion that is less than that of $Nb_3Sn$, a tensile strain—which tends to decrease the critical current of the at least one filament 110 and superconducting wire 100—is imparted to the at least one filament 110. Thus, metallic matrix 120 should have a coefficient of thermal expansion that is substantially the same as or greater than that of $Nb_3Sn$.

Metallic matrix 120 is formed from a metallic preform matrix that comprises tin. In one embodiment, the metallic preform matrix is a copper-tin bronze. The metallic preform matrix preferably comprises between about 5 atomic percent and about 13 atomic percent tin.

The superconducting wire 100 of the present invention is formed by first providing a niobium alloy comprising niobium, zirconium, and oxygen, wherein zirconium and oxygen are present in a ratio of about 1:2 (i.e., Zr:O is approximately 1:2). In one embodiment of the invention, the niobium alloy is prepared by first melting, preferably by vacuum arc melting, an alloy of elemental niobium and niobium oxide (hereinafter referred to as "$Nb_2O_5$") to decompose the $Nb_2O_5$ and produce an ingot of elemental niobium in which between about 1 and about 3 atomic percent oxygen are dissolved. Zirconium is then provided to the niobium ingot. A sufficient amount of zirconium is provided such that zirconium and oxygen are present in a ratio of about 1:2. Zirconium may comprise up to about 8 atomic percent of the niobium ingot. In one embodiment, an amount of zirconium that is sufficient to comprise about one atomic percent of the niobium alloy is provided. The niobium ingot and zirconium are then melted, preferably by vacuum arc re-melting, to form a niobium alloy in which zirconium and oxygen are present in solid solution in an atomic ratio of about 1:2 within the re-melted ingot. In one embodiment, the re-melted niobium alloy ingot, which now contains oxygen and zirconium in solid solution, is heat treated at a temperature between about 500° C. and about 900° C. to homogenize the re-melted niobium alloy ingot.

The re-melted niobium alloy ingot, now containing a solid solution of zirconium and oxygen, is next formed into at least one niobium alloy rod. The at least one niobium alloy rod may be formed by a variety of processes. In one embodiment, the at least one niobium alloy rod is electron discharge milled from the re-melted ingot. Alternatively, the at least one niobium alloy rod may be formed by other techniques, such as, but not limited to, casting at least one niobium alloy rod from the re-melted niobium alloy ingot, drawing at least one niobium alloy rod form the re-melted niobium alloy ingot, and extruding at east one niobium alloy rod from the re-melted niobium alloy ingot. Once formed, the mechanical workability of the at least one niobium alloy rod may be further increased by cold-working the at least one niobium alloy rod. Cold-working methods that may be used include, but are not limited to, swaging, extrusion, wire drawing, and the like.

A metallic matrix material is then provided to the at least one niobium alloy rod such that the metallic matrix material surrounds and contacts the at least one niobium alloy rod. In one embodiment, the metallic matrix material is provided to the at least one niobium alloy rod to form a preform in which the metallic matrix material surrounds and contacts the at least one niobium alloy rod. The metallic matrix material comprises between about 5 weight percent and about 13 weight percent tin. In one embodiment, the metallic matrix material is a copper-tin bronze. The preform may be formed by wrapping a sheet of the metallic matrix material around the at least one niobium alloy rod. Alternatively, the preform may be formed by providing the metallic matrix material in a solid form through which holes are drilled and into which the at least one niobium alloy rod is inserted.

The metallic matrix material and the at least one niobium alloy rod are then formed into a wire by first extruding the preform, followed by either wire-drawing or swaging the extruded preform. Once drawn or swaged, the preform may be re-stacked by repeating the extrusion step, followed by the drawing or swaging steps, to achieve the desired wire diameter. The re-stacking step may be repeated as many times as necessary until the desired wire diameter is obtained. The resulting wire comprises at least one filament surrounded by the metallic matrix material, wherein the at least one filament comprises a niobium alloy having oxygen and zirconium in solid solution in an atomic ratio of about 1:2.

After the wire is formed, it is heat treated at a predetermined temperature for a predetermined time, to form a superconducting wire 100 comprising filaments formed from a plurality of $Nb_3Sn$ grains having a plurality of $ZrO_2$ precipitates. In one embodiment, the drawn or swaged wire is heat treated for up to 48 hours at a temperature of between about 700° C. and about 1100° C. During the heat treatment, tin diffuses from the bronze metallic matrix material into the at least one filament and reacts with the elemental niobium therein to form grains of $Nb_3Sn$ in the filament. The $Nb_3Sn$ grains generally contain $ZrO_2$ precipitates.

In some instances, tin does not completely diffuse into the at least one filament 110. Consequently, the at least one filament 110 may comprise a reaction layer of $Nb_3Sn$ grains surrounding a core comprising elemental niobium.

Because $Nb_3Sn$ is a brittle material, the at least one filament 110 of superconducting wire 100 may be subject to breakage when superconducting wire 100 is, for example, wound with other wires to form a cable or wound around a magnet or motor armature. This difficulty may be overcome by winding the drawn or swaged wire prior to heat treatment.

Figure 2:
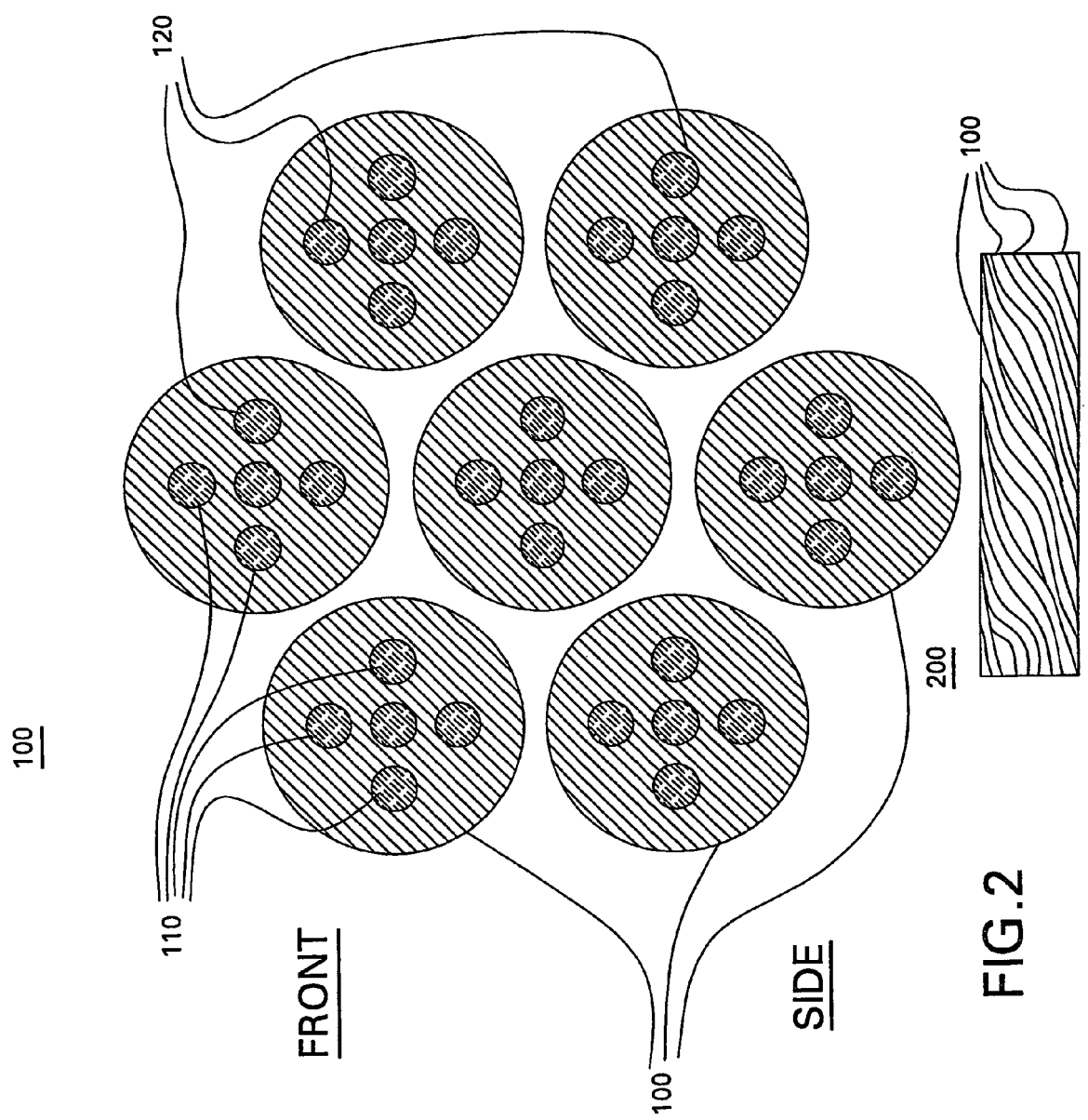
FIG. 2 is a schematic representation of side and cross-sectional views of a multi-wire cable formed from the superconducting wire of the present invention
Figure 3:
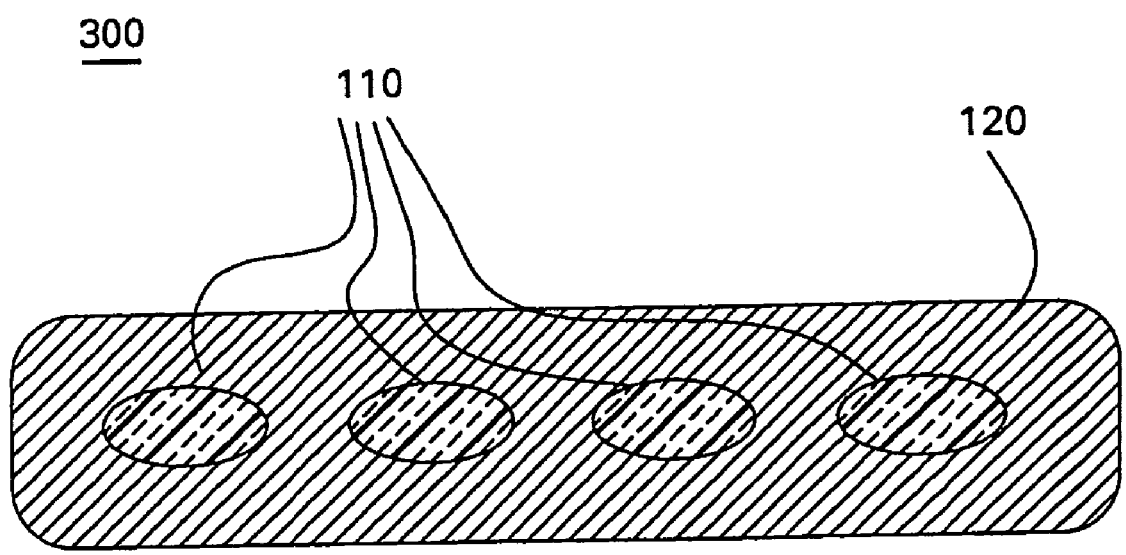
FIG. 3 is a schematic representation of a cross-sectional view of a flattened tape formed from the superconducting wire of the present invention.
Figure 4:
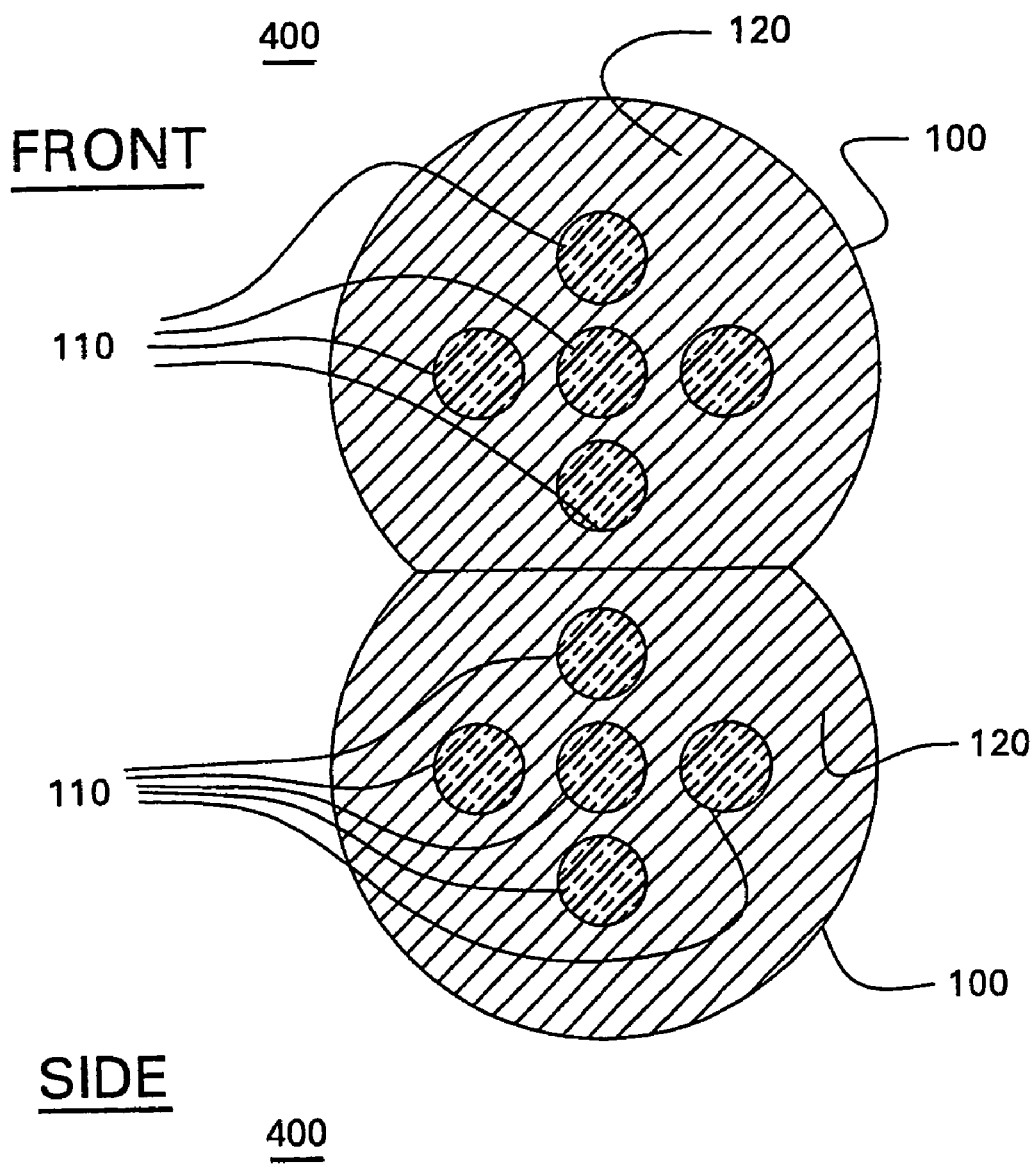
FIG. 4 is a schematic representation of side and cross-sectional views of a laminated wire formed from the superconducting wire of the present invention.
Figure 4:
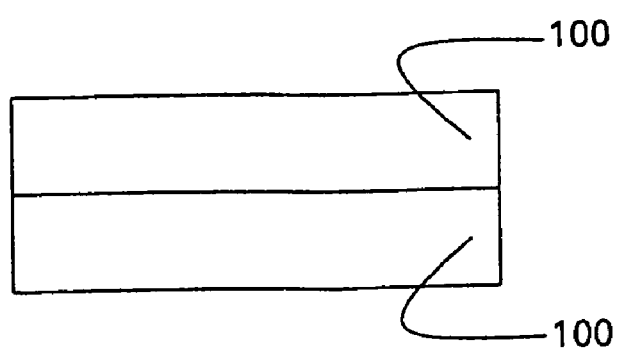

Superconducting wire 100 may be formed into similar electrically conducting structures, including, but not limited to, flattened tapes, laminated wires formed from multiple wires, and wound multi-wire cables. Schematic views of multi-wire cable 200, flattened tape 300, and laminated wire 400 formed from superconducting wire 100 are shown in FIGS. 2, 3, and 4, respectively. Applications for superconducting wire 100 are found in electromagnetic devices such as, but not limited to: superconducting magnets, such as that described in U.S. Pat. No. 6,172,588, entitled "Apparatus and Method for a Superconductive Magnet with Pole Piece," by Evangelos Trifon Laskaris and Michael Anthony Palmo, issued on Jan. 9, 2001, which is incorporated herein by reference in its entirety; motors; transformers; and generators. Such electromagnetic devices may in turn be incorporated into larger systems, such as, for example, a magnetic resonance imaging system.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

The invention claimed is:

1. A method of making a superconducting wire, comprising the steps of:
   a) melting an alloy of elemental niobium and $Nb_2O_5$ to produce an ingot of elemental niobium having oxygen dissolved therein;
   b) melting zirconium and the niobium ingot to form a niobium alloy, the niobium alloy having zirconium and oxygen in solid solution, wherein zirconium and oxygen are present in an atomic ratio of about 1:2;
   c) forming at least one niobium alloy rod from the niobium alloy;
   d) providing a metallic matrix material to the at least one niobium alloy rod;
   e) forming a wire from the metallic matrix material and the at least one niobium alloy rod, the metallic matrix material comprising between about 5 weight percent and about 13 weight percent Sn; and
   f) heat treating the wire at a predetermined temperature for a predetermined time such that the wire comprises filaments formed from a plurality of $Nb_3Sn$ grains having a plurality of $ZrO_2$ precipitates disposed therein, wherein the plurality of $Nb_3Sn$ grains have an average grain size of less than about 1 micron, thereby forming the superconducting wire.

2. The method according to claim 1, wherein the step of melting an alloy of elemental niobium and $Nb_2O_5$ to produce an ingot of elemental niobium having oxygen dissolved therein comprises vacuum arc melting the alloy.

3. The method according to claim 1, wherein the step of melting zirconium and the niobium ingot to form a niobium alloy having zirconium and oxygen in solid solution comprises vacuum arc remelting the zirconium and the niobium ignot.

4. The method according to claim 1, further including the step of homogenizing the niobium alloy.

5. The method according to claim 4, wherein the step of homogenizing the niobium alloy comprises heat treating the niobium alloy at a predetermined temperature for a predetermined time.

6. The method according to claim 1, wherein the step of forming at least one niobium alloy rod from the niobium alloy comprises one of electron discharge milling the niobium alloy to form at least one niobium alloy rod therefrom, casting at least one niobium alloy rod from the niobium alloy, extruding at least one rod from the niobium alloy, and drawing at least one niobium alloy rod from the niobium alloy.

7. The method according to claim 6, further including the step of cold-working the at least one niobium alloy rod.

8. The method according to claim 7, wherein the step of cold-working the at least one niobium alloy rod comprises at least one of swaging, extruding, and wire-drawing the at least one niobium alloy rod.

9. The method according to claim 1, wherein the step of forming a wire from the metallic matrix material and the at least one niobium alloy rod comprises:
   a) forming a preform by surrounding the at least one niobium alloy rod with the metallic matrix material such that the metallic matrix material contacts the at least one niobium alloy rod; and
   b) forming a wire from the preform.

10. The method according to claim 9, wherein the step of forming a wire from the preform comprises extruding the wire followed by one of drawing the wire and swaging the wire.

11. The method according to claim 10, further comprising the step of re-stacking the wire following one of drawing the wire and swaging the wire, wherein the step of re-stacking the wire comprises extruding the wire followed by one of drawing the wire and swaging the wire.

12. The method according to claim 11, wherein the step of re-stacking is repeated at least once.

13. The method according to claim 1, wherein the step of heat treating the wire at a predetermined temperature for a predetermined time comprises heat treating the wire at a temperature of between about 700° C. and about 1100° C. for a time of up to about 48 hours.

14. The method according to claim 1, wherein the step of heat treating the wire at a predetermined temperature for a predetermined time comprises winding the wire and heat treating the wire at a predetermined temperature for a predetermined time after winding the wire.

15. A method of making a preform for a superconducting wire, comprising the steps of:
   a) melting an alloy of elemental niobium and $Nb_2O_5$ to produce an ingot of elemental niobium having oxygen dissolved therein;
   b) melting zirconium and the niobium ingot to form a niobium alloy, the niobium alloy having zirconium and oxygen in solid solution wherein zirconium and oxygen are present in an atomic ratio of about 1:2; and
   c) forming at least one niobium alloy rod from the niobium alloy;
   d) forming a preform by surrounding the at least one niobium alloy rod with a metallic matrix material comprising Sn such that the metallic matrix material contacts the at least one niobium alloy rod.

16. The method according to claim 15, wherein the step of melting an alloy of elemental niobium and $Nb_2O_5$ to produce an ingot of elemental niobium having oxygen dissolved therein comprises vacuum arc melting the alloy.

17. The method according to claim 15, wherein the step of melting zirconium and the niobium ingot to form a niobium alloy having zirconium and oxygen in solid solution comprises vacuum arc remelting the zirconium and the niobium ignot.

18. The method according to claim 17, further including the step of homogenizing the niobium alloy.

19. The method according to claim 18, wherein the step of homogenizing the niobium alloy comprises heat treating the niobium alloy at a predetermined temperature for a predetermined time.

20. The method according to claim 15, wherein the step of forming at least one niobium alloy rod from the niobium alloy comprises one of electron discharge milling the niobium alloy to form at least one niobium alloy rod therefrom, casting at least one niobium alloy rod from the niobium alloy, extruding at least one rod from the niobium alloy, and drawing at least one niobium alloy rod from the niobium alloy.

21. The method according to claim 15, further including the step of cold-working the at least one niobium alloy rod.

22. The method according to claim 21, wherein the step of cold-working the at least one niobium alloy rod comprises at least one of swaging, extruding, and wire-drawing the at least one niobium alloy rod.

23. The method according to claim 15, further including the steps of:
   a) forming a wire from the metallic matrix material and the at least one niobium alloy rod; and
   b) heat treating the wire at a predetermined temperature for a predetermined time such that the wire comprises filaments formed from a plurality of $Nb_3Sn$ grains having a plurality of $ZrO_2$ precipitates disposed therein, wherein the plurality of $Nb_3Sn$ grains have an average grain size of less than about 1 micron, thereby forming the superconducting wire.

24. The method of claim 15, wherein an amount of Sn in the metallic matrix material is between about 5 weight percent and about 13 weight percent.

25. A method of making a superconducting wire, comprising the steps of:
   a) melting an alloy of elemental niobium and $Nb_2O_5$ to produce an ingot of elemental niobium having oxygen dissolved therein;
   b) melting zirconium and the niobium ingot to form a niobium alloy, the niobium alloy having zirconium and oxygen in solid solution, wherein zirconium and oxygen are present in an atomic ratio of about 1:2;
   c) forming at least one niobium alloy rod from the niobium alloy;
   d) forming a wire from a metallic matrix material and the at least one niobium alloy rod, the metallic matrix material comprising a mixture of Cu and Sn; and
   e) heat treating the wire at a predetermined temperature for a predetermined time such that the wire comprises filaments formed from a plurality of $Nb_3Sn$ grains having a plurality of $ZrO_2$ precipitates disposed therein, wherein the plurality of $Nb_3Sn$ grains have an average grain size of less than about 1 micron, thereby forming the superconducting wire.

26. The method according to claim 25, further including the step of cold-working the at least one niobium alloy rod.

27. The method according to claim 26, wherein the step of cold-working the at least one niobium alloy rod comprises at least one of swaging, extruding, and wire-drawing the at least one niobium alloy rod.

28. The method according to claim 25, wherein the step of forming a wire from the metallic matrix material and the at least one niobium alloy rod comprises:
   a) forming a preform by surrounding the at least one niobium alloy rod with the metallic matrix material such that the metallic matrix material contacts the at least one niobium alloy rod; and
   b) forming a wire from the preform.

29. The method according to claim 28, wherein the step of forming a wire from the preform comprises extruding the wire followed by one of drawing the wire and swaging the wire.

30. The method according to claim 29, further comprising the step of re-stacking the wire following one of drawing the wire and swaging the wire, wherein the step of re-stacking the wire comprises extruding the wire followed by one of drawing the wire and swaging the wire.

31. The method according to claim 30, wherein the step of re-stacking is repeated at least once.

32. The method according to claim 25, wherein the step of heat treating the wire at a predetermined temperature for a predetermined time comprises heat treating the wire at a temperature of between about 700° C. and about 1100° C. for a time of up to about 48 hours.

33. The method according to claim 25, wherein the step of heat treating the wire at a predetermined temperature for a predetermined time comprises winding the wire and heat treating the wire at a predetermined temperature for a predetermined time after winding the wire.

* * * * *

UNITED STATES PATENT AND TRADEMARK OFFICE
CERTIFICATE OF CORRECTION

PATENT NO. : 7,325,293 B2
APPLICATION NO. : 11/406636
DATED : February 5, 2008
INVENTOR(S) : Benz et al.

It is certified that error appears in the above-identified patent and that said Letters Patent is hereby corrected as shown below:

In Column 7, Line 38, in Claim 3, delete "ignot." and insert -- ingot. --, therefor.

In Column 8, Line 46, in Claim 17, delete "ignot." and insert -- ingot. --, therefor.

Signed and Sealed this

Eighteenth Day of November, 2008

JON W. DUDAS
*Director of the United States Patent and Trademark Office*